(12) United States Patent
Elian

(10) Patent No.: US 7,374,858 B2
(45) Date of Patent: May 20, 2008

(54) POLYMERIZABLE COMPOSITIONS; POLYMER, RESIST, AND LITHOGRAPHY METHOD

(75) Inventor: Klaus Elian, Erlangen (DE)

(73) Assignee: Qimonda AG, Munich (DE)

( * ) Notice: Subject to any disclaimer, the term of this patent is extended or adjusted under 35 U.S.C. 154(b) by 258 days.

(21) Appl. No.: 10/520,534

(22) PCT Filed: Jul. 21, 2003

(86) PCT No.: PCT/DE03/02502

§ 371 (c)(1),
(2), (4) Date: Jan. 6, 2005

(87) PCT Pub. No.: WO2004/017142

PCT Pub. Date: Feb. 26, 2004

(65) Prior Publication Data

US 2006/0063100 A1   Mar. 23, 2006

(30) Foreign Application Priority Data

Jul. 22, 2002   (DE) ................. 102 33 849

(51) Int. Cl.
| | | |
|---|---|---|
| G03C 1/492 | (2006.01) | |
| G03C 1/494 | (2006.01) | |
| G03C 1/76 | (2006.01) | |
| G03C 5/00 | (2006.01) | |
| C08G 77/26 | (2006.01) | |

(52) U.S. Cl. ............... 430/270.1; 430/311; 430/322; 528/38

(58) Field of Classification Search .............. 528/38; 430/270.1, 311, 322
See application file for complete search history.

(56) References Cited

U.S. PATENT DOCUMENTS

| | | | |
|---|---|---|---|
| 4,820,607 A | | 4/1989 | Aoai |
| 5,066,751 A | | 11/1991 | Kotachi et al. |
| 5,104,479 A | | 4/1992 | Kotachi et al. |
| 5,153,103 A | | 10/1992 | Kotachi et al. |
| 5,981,141 A | | 11/1999 | Choi et al. |
| 6,054,255 A | * | 4/2000 | Nakaoka et al. ............ 430/327 |
| 6,063,543 A | | 5/2000 | Hien et al. |
| 6,146,793 A | | 11/2000 | Schaedeli et al. |
| 6,303,268 B1 | | 10/2001 | Namba et al. |
| 6,380,339 B1 | | 4/2002 | Fang et al. |
| 2002/0061465 A1 | | 5/2002 | Hasegawa et al. |

FOREIGN PATENT DOCUMENTS

| | | |
|---|---|---|
| DE | 100 61 675 A1 | 4/2002 |
| EP | 0 379 173 A1 | 7/1990 |
| EP | 0 447 111 A1 | 9/1991 |
| EP | 0 957 399 A2 | 11/1999 |
| JP | 63-145287 | 6/1988 |

* cited by examiner

*Primary Examiner*—Geraldina Visconti
(74) *Attorney, Agent, or Firm*—Slater & Matsil, L.L.P.

(57) ABSTRACT

A polymerizable composition for the production of a resist includes at least one unsaturated, polymerizable monomer. This monomer has at least one silicon atom and at least one carbonyl group.

6 Claims, 2 Drawing Sheets

(I)

(II)

POLYMERIZABLE COMPOSITIONS; POLYMER, RESIST, AND LITHOGRAPHY METHOD

TECHNICAL FIELD

The invention relates to a polymerizable composition for the production of a resist, polymer prepared by polymerization, and a lithography process.

BACKGROUND

Photomasks as used in semiconductor lithography currently generally consist of a transparent quartz glass plate on which a structured, nontransparent chromium layer is applied (COG: chrome on glass). In the production process, so-called mask blanks are used for this purpose. These are quartz glass plates whose surface is completely covered with a continuous chromium layer which at present is from about 30 to 100 nm thick.

These mask blanks are coated with a photosensitive or electron-sensitive resist and recorded on in a completely targeted manner using any desired layout, for example by means of laser recorders or electron beam recorders. Thereafter, the resist layer is developed and, in the case of the positive resist, the resist is removed in the parts previously recorded on. In the case of a negative resist, on the other hand, the resist is removed in the unexposed parts.

A relief-like image of the previously recorded structure results in the resist. The resist protects the chromium layer in defined parts (the previously exposed or unexposed parts, depending on the resist system), whereas the chromium between these parts is bare and can be further treated in a specific manner.

In mask production, the further treatment comprises targeted removal of the chromium layer by plasma etching. The structure produced beforehand in the resist is transferred here into the chromium layer by removing the bare chromium (not protected by resist) in a reactive ion plasma consisting, for example, of a chlorine/oxygen gas mixture.

The problem here, however, is that large amounts of oxygen have to be employed in the plasma to make it possible to remove sufficient chromium into the gas phase. The chromium must be converted into readily volatile chromium oxides or chromium halogen oxides in order to be capable of being effectively removed finally. However, this large amount of oxygen attacks the resist present on the chromium to a very great extent so that said resist too is gradually removed, in particular laterally. Resist lines present on the chromium are 'shrunk', for example by values of about 30 to 60 nm per edge, during the etching. This reduced geometry is also transferred to the chromium layer so that, after the etching process, the faithfulness of the chromium structures to the original (in comparison with the theoretical layout structure) is not ensured. A frequent rule of thumb is that at present there is a loss of about 50 nm (overetching) per structure edge; this means that, after etching, structure lines are invariably about 100 nm narrower than provided for by the theoretical layout.

In the case of the target structure sizes required to date (structure dimensions greater than or equal to 0.25 µm), this etching loss was still tolerable under certain circumstances since the loss of the dimensional stability was corrected in the design itself by a changed recorder layout by recording trenches to be produced 100 nm narrower or lines to be produced 100 nm broader as early as during the structuring of the photoresist layer. By means of this recording reserve, it was possible to compensate the etching loss in advance.

This recording reserve is, however, no longer tolerable in the production of masks having structure dimensions of less than 0.25 µm, in particular from the technology generation for 70 nm structures.

Although the principle of 4 times reduction is still employed, i.e. the structures in the mask may still be four times as large as they are subsequently produced as images on the wafer, in particular the optical proximity correction features (OPC) on the mask which are not be imaged achieve in this case an order of magnitude which can no longer be realized with the mask wafers then available (laser or electron beam recording method). The additional OPC structures will, for example, in the very near future already have dimensions of 100 nm or less and have to be a defined distance away from the main structures on the mask. In the case of these fine structure dimensions, a preceding correction of the layout (structure reserve) is no longer possible since, for example in the case of a required distance of 100 nm and simultaneous required structure reserve of in each case 50 nm per edge, the structures would collapse into a single one in the layout itself. Even if this was still not to be the case for an uncritical distance of, for example, 150 nm, no resist would currently resolve the remaining distance of 50 nm.

SUMMARY

The only possibility for solving this problem is the following: the etching loss must be dramatically reduced (target value: etching loss=zero).

It is the object of the present invention to provide a resist and an electron beam recording process by means of which the etching loss can be reduced.

This object is achieved, according to the invention, by a polymerizable composition for the production of a resist, comprising at least one unsaturated, polymerizable monomer having at least one silicon atom and at least one cabonyl group.

The subject of claim 1 is a monomer of a resist which solves the problem of the chromium etching loss by substantially higher etching stability with respect to the chlorine/oxygen plasmas used in mask production.

The invention solves the problem by using a special monomer with which resist having greatly increased stability with respect to the etching plasmas used is employed. Compared with all resist systems usually used to date in mask recording, the proposed resist contains chemically incorporated silicon. This surprisingly results in substantially increased etching stability in the final chromium etching process compared with all other commercial resists. The silicon is oxidized in the etching plasma having a high oxygen content to give nonvolatile silica, which very greatly limits or prevents the lateral resist shrinkage.

As a result of the very greatly increased etching stability, the resist and chromium etching loss is limited to virtually zero, which means that there is no longer any necessity to record a structure reserve in the electron beam recording process. Consequently, the requirements with regard to the mask recorder resolution are reduced to such an extent that the future technology generation of the 70 and 50 nm masks can be coped with by the mask recorders. Without the reduction in the chromium etching loss, the future apparatuses too would not be able to cope with these technology nodes at all, owing to the resolution limit still present.

The use of the proposed resist requires no additional effort or apparatuses for the production; exactly the same processing takes place as in the case of the resist systems which have been used for some years.

BRIEF DESCRIPTION OF THE DRAWINGS

For a more complete understanding of the present invention, and the advantages thereof, reference is now made to the following descriptions taken in conjunction with the accompanying drawing, in which.

DETAIL DESCRIPTION OF THE ILLUSTRATIVE EMBODIMENTS

Figure 1:
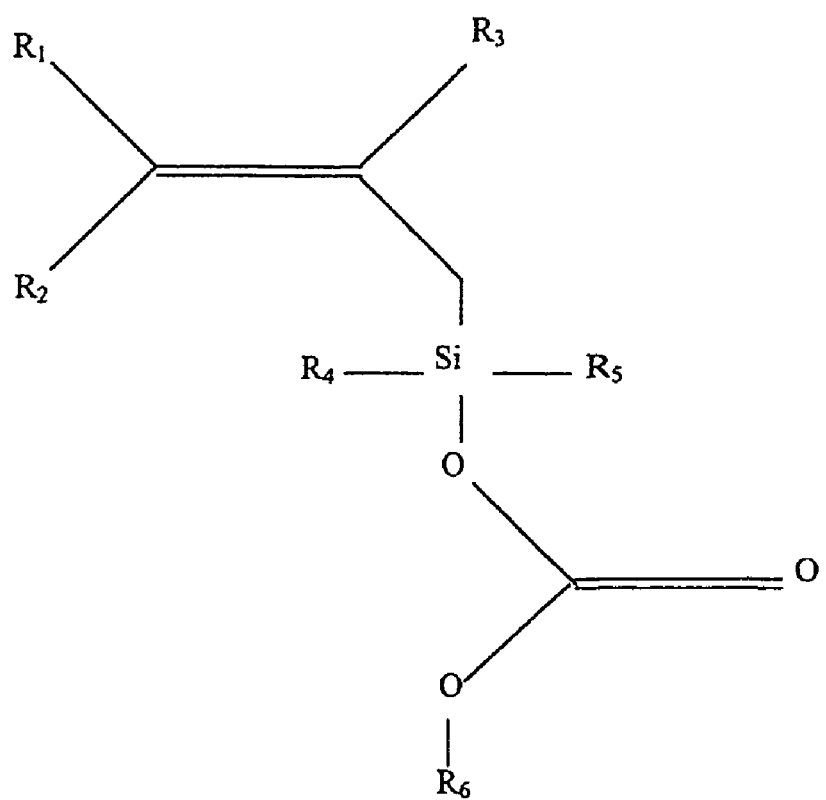
FIG. 1 shows the general formula of a first embodiment monomer.
Figure 2:
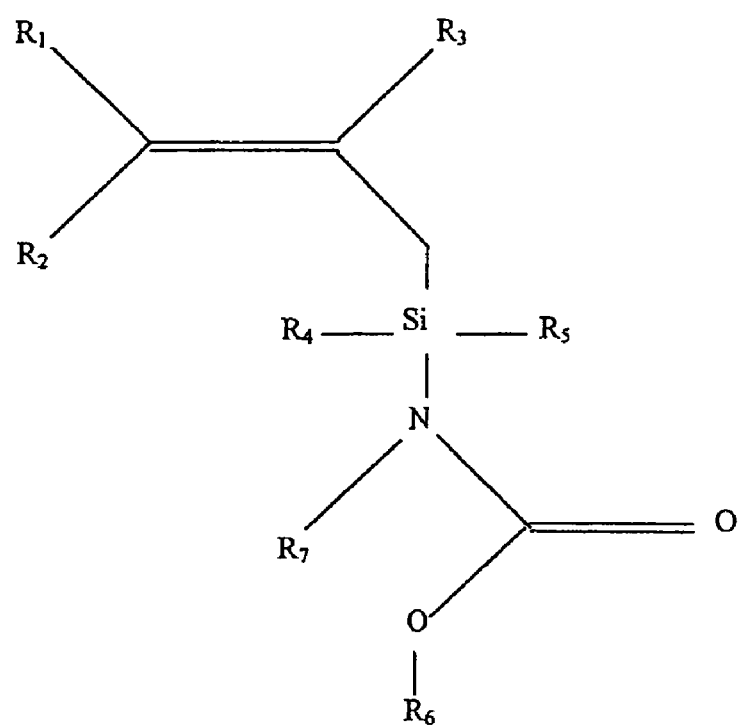
FIG. 2 shows the general formula of a second embodiment monomer.

Two advantageous monomers by means of which a resist according to the invention can be produced are described below. The first embodiment is shown in FIG. 1 and the second in FIG. 2. The following radicals are used.

$R_1$, $R_2$, $R_3$: H or alkyl radicals (preferably H or methyl radicals)

$R_4$, $R_5$: alkyl radicals (preferably methyl radicals), or further silicon units, e.g. siloxane units $R_6$: alkyl radical (preferably tert-butyl radical radical)

$R_7$: H or alkyl radical (preferably methyl radical)

These monomers can easily be polymerized with themselves or together with other monomers (e.g. maleic anhydride, styrene, p-hydroxystyrene, methacrylic acid or the like), for example by free radical polymerization, and are thus used as a key component in resists according to the invention.

The improvement in the dimensional stability of the resist layer is achieved by increasing the silicon content of the polymer. It can therefore be expected that the silicon content is 5-25% by weight, depending on the monomer used.

A typical resist mixture may consist, for example, of:

70-98% of solvent (methoxypropyl acetate, ethyl acetate, ethyl lactate, cyclohexanone, gamma-butyrolactone, methyl ethyl ketone or the like)

2-30% of polymerizable polymers, 0.1-10% of photo acid generator (e.g. Crivello salts, triphenylsulfonium sulfonates, diphenyliodonium sulfonates, phthalimidosulfonates, ortho-nitrobenzylsulfonates or the like).

According to the invention, the resist can be used in a laser or electron beam lithography process.

First, a mask blank is coated with the resist solution according to the invention. Recording on the resist by means of a laser and/or electron beam recorder is then effected. Thereafter, a heating step can, but need not, be carried out. The recorded resist can then be developed in an aqueous alkaline developer medium (i.e. 2.38% strength aqueous tetramethylammonium hydroxide solution, standard TMAH developer). Finally, the mask blank is dry-etched with a chlorine/oxygen gas mixture, for example using a reactive ion plasma (RIE). During this procedure, the chromium layer is etched; the resist remains substantially unattacked. Thus, the structure which is originally recorded in the resist is transferred to the chromium.

WORKING EXAMPLE OF THE INVENTION

A working example using the monomer according to FIG. 1 is described below.

50 mmol of allyldimethylchlorosilane are dissolved in 250 ml of diethyl ether, 250 ml of water are added with vigorous stirring in the course of 1 h and then refluxing is carried out for 1 h.

The ethereal phase is separated off over a separating funnel and dried for 24 h over calcium chloride. It is filtered off and the filtrate is added dropwise in the course of 1 h to an ice-cool solution of 50 mmol of dietrbutyl pyrocarbonate in anhydrous diethyl ether. The reaction mixture is extracted 3 times thoroughly by shaking with water, and the organic phase is then separated off in a separating funnel and again dried for 24 h over calcium chloride. Evaporation of the diethyl ester in a rotary evaporator gave the highly contaminated product as a yellowish liquid.

If this liquid is dissolved in 100 ml of methyl ethyl ketone and then heated to the boil and a mixture of 50 mmol of maleic anhydride, 5 mmol of azobisisobutyronitrile and 100 ml of methyl ethyl ketone is then added dropwise in the course of 2 h, the mixture polymerizes and, after cooling and dropwise addition to 2 l of water, gives a virtually colorless polymer, which is filtered off and dried in a vacuum drying oven at 50° C.

This polymer can be used as a key component for the mixture of a resist.

When carried out, the invention is not limited to the abovementioned preferred working examples. Rather, a number of variants which make use of the polymerizable composition as claimed in the invention, the polymer, the resist and the lithography process also in embodiments of basically different types is conceivable.

The invention claimed is:

1. A polymerizable composition for the production of a resist, comprising at least one unsaturated, polymerizable monomer having at least one silicon atom and at least one carbonyl group, a monomer of the general formula:

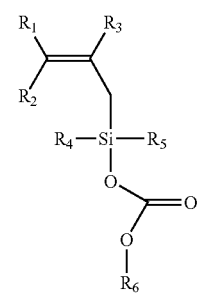

wherein:
$R_1$, is selected from the group consisting of H and alkyl radicals;
$R_2$, is selected from the group consisting of H and alkyl radicals;
$R_3$ is selected from the group consisting of H and alkyl radicals;
$R_4$ comprises alkyl radicals and/or a silicon-containing compound;
$R_5$ comprises alkyl radicals and/or a silicon-containing compound;
$R_6$ comprises alkyl radicals; and wherein $R_1$, $R_2$, $R_3$ and $R_6$ are either identical or different from one another and
   wherein either $R_4$ or $R_5$ both comprise a silicon-containing compound.

2. The polymerizable composition as claimed in claim 1 wherein at least one of $R_1$, $R_2$, $R_3$ comprises a methyl radical.

3. The polymerizable composition as claimed in claim 1 wherein at least one of $R_4$ and $R_5$ comprises a methyl radical or siloxane.

4. The polymerizable composition as claimed in claim 1 wherein $R_6$ comprises a tert-butyl radical.

5. The polymerizable composition as claimed in claim 1, wherein at least one alkyl radical has a chain length of $C_1$ to $C_8$.

6. A polymer prepared by polymerization of at least the composition as claimed in claim 1.

* * * * *

UNITED STATES PATENT AND TRADEMARK OFFICE
CERTIFICATE OF CORRECTION

PATENT NO. : 7,374,858 B2 Page 1 of 1
APPLICATION NO. : 10/520534
DATED : May 20, 2008
INVENTOR(S) : Elian It is certified that error appears in the above-identified patent and that said Letters Patent is hereby corrected as shown below:

In Col. 1, line 8, before polymer insert --a--.
In Col. 1, line 9, before and insert --a resist--.
In Col. 2, line 39, delete "cabonyl" and insert --carbonyl--.
In Col. 3, line 18, delete "DETAIL" and insert --DETAILED--.
In Col. 5, line 3, before both insert --or--.

Signed and Sealed this

Thirtieth Day of December, 2008

JON W. DUDAS
*Director of the United States Patent and Trademark Office*